US010447010B2

(12) United States Patent
Choi

(10) Patent No.: US 10,447,010 B2
(45) Date of Patent: Oct. 15, 2019

(54) METHOD AND APPARATUS FOR CONTROLLING EXTERNAL CAVITY LASER

(71) Applicant: ELECTRONICS AND TELECOMMUNICATIONS RESEARCH INSTITUTE, Daejeon (KR)

(72) Inventor: Byung-Seok Choi, Daejeon (KR)

(73) Assignee: ELECTRONICS AND TELECOMMUNICATIONS RESEARCH INSTITUTE, Daejeon (KR)

(*) Notice: Subject to any disclaimer, the term of this patent is extended or adjusted under 35 U.S.C. 154(b) by 138 days.

(21) Appl. No.: 15/229,432

(22) Filed: Aug. 5, 2016

(65) Prior Publication Data

US 2017/0163009 A1    Jun. 8, 2017

(30) Foreign Application Priority Data

Dec. 4, 2015   (KR) .................. 10-2015-0172577

(51) Int. Cl.
*H01S 5/14*     (2006.01)
*H01S 5/0687*   (2006.01)
(Continued)

(52) U.S. Cl.
CPC .......... *H01S 5/141* (2013.01); *H01S 5/02438* (2013.01); *H01S 5/0687* (2013.01);
(Continued)

(58) Field of Classification Search
CPC .. H01S 5/141; H01S 5/02438; H01S 5/06255; H01S 5/0687
See application file for complete search history.

(56) References Cited

U.S. PATENT DOCUMENTS 6,303,040 B1   10/2001   Oh et al.
8,548,015 B2   10/2013   Choi
(Continued)

FOREIGN PATENT DOCUMENTS

KR   10-2000-0018925 A   4/2000
KR   10-2007-0059895 A   6/2007
(Continued)

OTHER PUBLICATIONS

Min-Cheol Oh et al., "Tunable wavelength filters with Bragg gratings in polymer waveguides", Applied Physics Letters, vol. 73, No. 18, pp. 2543-2545, Nov. 2, 1998.
(Continued)

*Primary Examiner* — Xinning(Tom) Niu
*Assistant Examiner* — Sean P Hagan
(74) *Attorney, Agent, or Firm* — Rabin & Berdo, P.C.

(57) ABSTRACT

Provided herein are a method and apparatus for controlling the wavelength of an external-cavity wavelength-tunable laser. The reflectivity or transmittance characteristics of a wavelength depend on the phase difference between light reflected by a wavelength-tunable filter and parasitic reflective light. Thus, when the temperature of a module and current applied to a phase control electrode and an external reflector are changed, the characteristics are changed in a periodic manner. The present disclosure relates to a wavelength control algorithm of determining combinations of these parameters to set conditions having optimum chirping characteristics at a desired wavelength.

10 Claims, 23 Drawing Sheets

(51) Int. Cl.
*H01S 5/024* (2006.01)
*H01S 3/106* (2006.01)
*H01S 5/06* (2006.01)

(52) U.S. Cl.
CPC .......... *H01S 3/106* (2013.01); *H01S 5/02415* (2013.01); *H01S 5/0617* (2013.01); *H01S 2301/02* (2013.01)

(56) References Cited

U.S. PATENT DOCUMENTS

| | | | | |
|---|---|---|---|---|
| 8,885,678 | B1* | 11/2014 | Kupershmidt | H01S 5/06817 372/21 |
| 2004/0131102 | A1* | 7/2004 | Jette | B82Y 20/00 372/97 |
| 2005/0220458 | A1* | 10/2005 | Kupershmidt | H01S 5/141 398/196 |
| 2007/0071389 | A1 | 3/2007 | Yoon et al. | |
| 2007/0133647 | A1* | 6/2007 | Daiber | H01S 5/026 372/99 |
| 2009/0060526 | A1* | 3/2009 | Matsui | G02B 6/12007 398/185 |
| 2010/0316383 | A1 | 12/2010 | Kim et al. | |

FOREIGN PATENT DOCUMENTS

| | | |
|---|---|---|
| KR | 10-2009-0011837 A | 2/2009 |
| WO | WO-2009-017335 A1 | 2/2009 |

OTHER PUBLICATIONS

Jie Hyun Lee et al., "Tunable External Cavity Laser Based on Polymer Waveguide Platform for WDM Access Network", IEEE Photonics Technology Letters, vol. 17, No. 9, pp. 1956-1958, Sep. 2005.

Byung-Seok Choi et al., "10-Gb/s direct modulation of polymer-based tunable external cavity lasers", Optics Express, vol. 20, No. 18, pp. 20368-20375, Aug. 21, 2012.

Byung-Seok Choi et al., "Evaluation of Chirp Reduction in Polymer-Based Tunable External-Cavity Lasers", IEEE Journal of Quantum Electronics, vol. 51, No. 1, Jan. 2015.

Byung-Seok Choi et al., "Simple detuning method for lowchirp operation in polymer-based tunable external-cavity lasers", Optics Express, vol. 23, No. 24, pp. 30657-30666, Nov. 16, 2015.

* cited by examiner

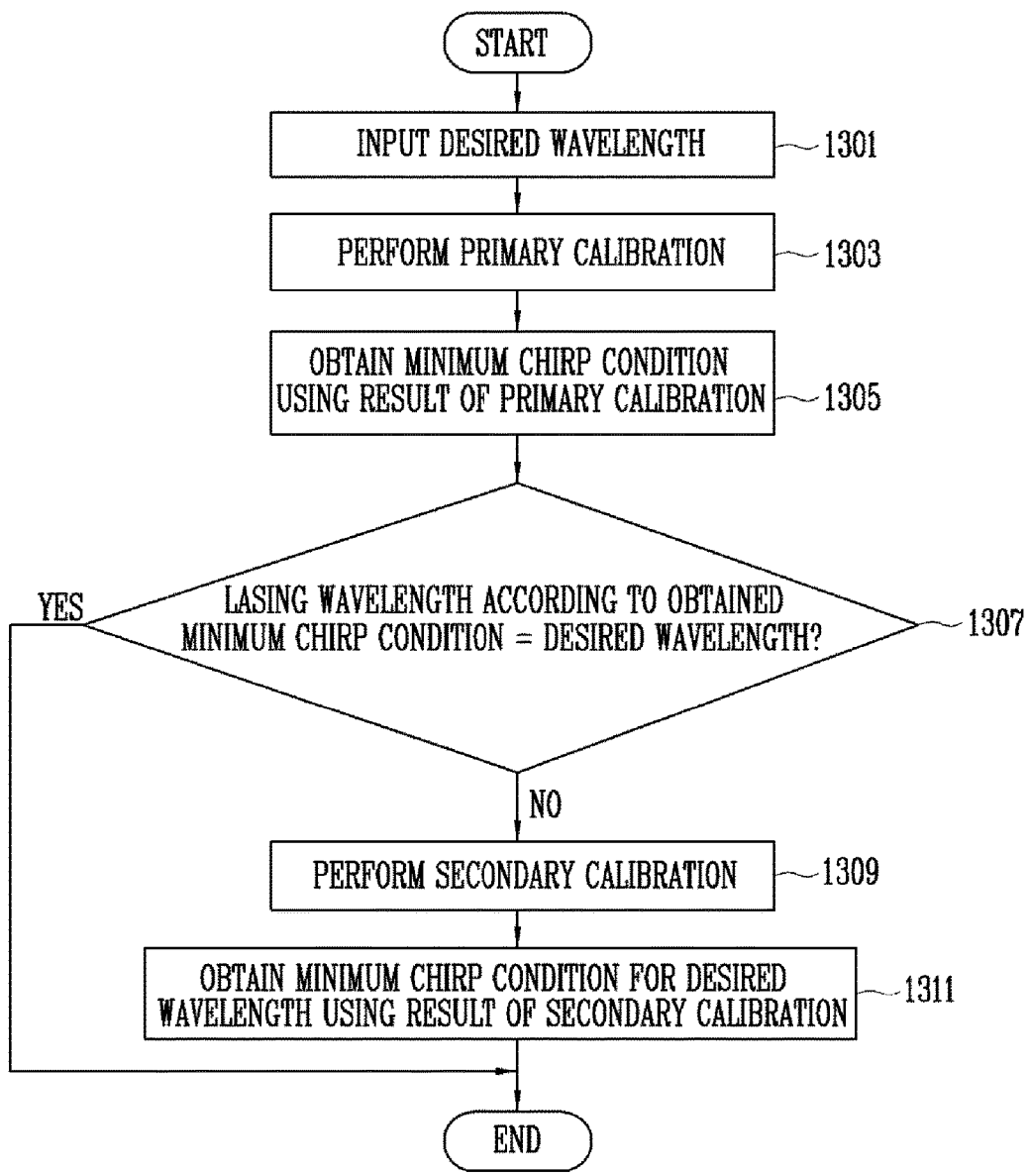

METHOD AND APPARATUS FOR CONTROLLING EXTERNAL CAVITY LASER

CROSS-REFERENCE TO RELATED APPLICATION

The present application claims priority to Korean patent application number 10-2015-0172577 filed on Dec. 4, 2015, the entire disclosure of which is herein incorporated by reference in its entirety.

BACKGROUND

Field of Invention

Various embodiments of the present disclosure relate to a method of controlling an external cavity laser, and more particularly, to a control method for a low-chirp operation of an external-cavity wavelength-tunable laser which is used for optical communication.

Description of Related Art

Generally, the most basic elements forming a LASER (Light Amplification by Stimulated Emission of Radiation) include a gain medium and a resonator having a pump for the supply of energy. To amplify radiated light through a stimulated emission process, a gain medium is absolutely necessary. The lasing wavelength band of the laser is determined depending on the kind of gain medium. Depending on the kind of gain medium, a gas laser, a dye laser, a solid-state layer, and so forth are representative examples of a laser that is relatively easily tunable in wavelength.

Research on a Wavelength Division Multiplexing (WDM)-based passive optical network (PON) (hereinafter, referred to as a 'WDM-PON'), which is a network based on wavelength adjustment, has become appreciably more active. The WDM-PON may provide voice, data and broadcast convergence services.

In a WDM-PON, wavelengths assigned to respective subscribers are used for communication between a center office (CO) and the subscribers. Because the WDM-PON uses an exclusive wavelength for each subscriber, there are advantages in that security is excellent, massive communication service is possible, and the application of transmission technologies having different link rates and frame formats, etc. by subscribers or services is possible.

However, because the WDM-PON is a technology of multiplexing several wavelengths on a single optical fiber using the WDM technology, a number of different light sources, equal to the number of subscribers belonging to a single remote node (RN), are required. The production, installation and management of light sources for respective wavelengths imposes a huge financial burden on both users and business operators and thus is the chief obstacle to the commercialization of the WDM-PON. To overcome the foregoing problems, research on a method of using a wavelength-tunable light source device capable of selectively tuning the wavelength of a light source has become more active.

SUMMARY

Various embodiments of the present disclosure are directed to a method of operating an external-cavity wavelength-tunable laser in a low chirp state.

One embodiment of the present disclosure provides a method of controlling a wavelength of an external-cavity wavelength-tunable laser, including: performing primary calibration of obtaining a wavelength-tunable curve within a wavelength range of the external-cavity wavelength-tunable laser; performing secondary calibration of obtaining a minimum chirp condition curve within the wavelength range of the external-cavity wavelength-tunable laser; and performing a wavelength locking operation of setting, based on results of the primary calibration and the secondary calibration, a heater power of an external reflector and a module temperature and a current of a phase control unit such that the external-cavity wavelength-tunable laser is operated under a minimum chirp condition at a specific wavelength, wherein the secondary calibration comprises obtaining the minimum chirp condition curve, at an arbitrary heater power of the external reflector and an arbitrary module temperature, based on a change of output power depending on a change in the current of the phase control unit of the external-cavity wavelength-tunable laser.

The primary calibration may be performed based on a wavelength change depending on the heater power of the external reflector and the module temperature.

The performing of the second calibration may include: changing the current of the phase control unit at the arbitrary heater power of the external reflector and the arbitrary module temperature, and monitoring the output power; determining that a case where a maximum value of the monitored output power is a smallest value is the minimum chirp condition at the arbitrary heater power of the external reflector and the arbitrary module temperature; and obtaining the minimum chirp condition curve based on the determined minimum chirp condition.

The monitoring of the output power may include: monitoring output power coming out of a high-reflective coated surface of a gain medium of the external-cavity wavelength-tunable laser.

The secondary calibration may be performed based on the heater power of the external reflector of the external-cavity wavelength-tunable laser and the module temperature.

In the case where the maximum value of the monitored output power is the smallest value, the current of the phase control unit may be set by applying an offset to the smallest value of the output power.

The method may further include: determining a current value of the phase control unit for the wavelength locking operation depending on the minimum chirp condition curve, wherein the current value of the phase control unit may be a current value of the phase control unit that results in an identical output power.

The performing of the second calibration may include: changing the current of the phase control unit at the arbitrary heater power of the external reflector and the arbitrary module temperature and monitoring the output power; determining that a case where maximum values of the monitored output power are largest values is the minimum chirp condition at the arbitrary heater power of the external reflector and the arbitrary module temperature; and obtaining the minimum chirp condition curve based on the determined minimum chirp condition.

Another embodiment of the present disclosure provides an apparatus of controlling a wavelength of an external-cavity wavelength-tunable laser, including: an external-cavity wavelength-tunable laser configured to output light within a tunable wavelength range; and a control unit configured to control output of the external-cavity wavelength-tunable laser, wherein the external-cavity wavelength-tunable laser includes: a gain medium for lasing radiated light; an external reflector configured to control a central wavelength of the lased light; and a phase control unit configured to control a lasing mode phase of the lased light, wherein the control unit performs primary calibration of obtaining a wavelength-tunable curve within a wavelength range of the external-cavity wavelength-tunable laser, secondary calibration of obtaining a minimum chirp condition curve at arbitrary heater power of the external reflector and an arbitrary module temperature based on a change of output power depending on a change in a current of the phase control unit, and a wavelength locking operation of setting, based on results of the primary calibration and the secondary calibration, the heater power of the external reflector and the module temperature such that the external-cavity wavelength-tunable laser is operated under a minimum chirp condition at a specific wavelength.

The phase control unit may be integrated on the external reflector.

The phase control unit may be integrated on the gain medium.

The control unit may perform the primary calibration based on a wavelength change depending on the heater power of the external reflector and the module temperature.

The control unit may change the current of the phase control unit at the arbitrary heater power of the external reflector and the arbitrary module temperature, and monitor the output power; determine that the case where a maximum value of the monitored output power is a smallest value is the minimum chirp condition at the arbitrary heater power of the external reflector and the arbitrary module temperature; and obtain the minimum chirp condition curve.

The output power may be output power coming out of a high-reflective coated surface of the gain medium.

The control unit may perform the secondary calibration based on the heater power of the variable operating external reflector of the external-cavity wavelength-tunable laser and the module temperature.

The control unit may change the current of the phase control unit at the arbitrary heater power of the external reflector and the arbitrary module temperature and monitor the output power; determine that a case where a maximum value of the monitored output power is a largest value is the minimum chirp condition at the arbitrary heater power of the external reflector and the arbitrary module temperature; and obtain the minimum chirp condition curve.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 13 is a flowchart showing a method of controlling the external-cavity wavelength-tunable laser according to an embodiment of the present disclosure.

DETAILED DESCRIPTION

Figure 1:
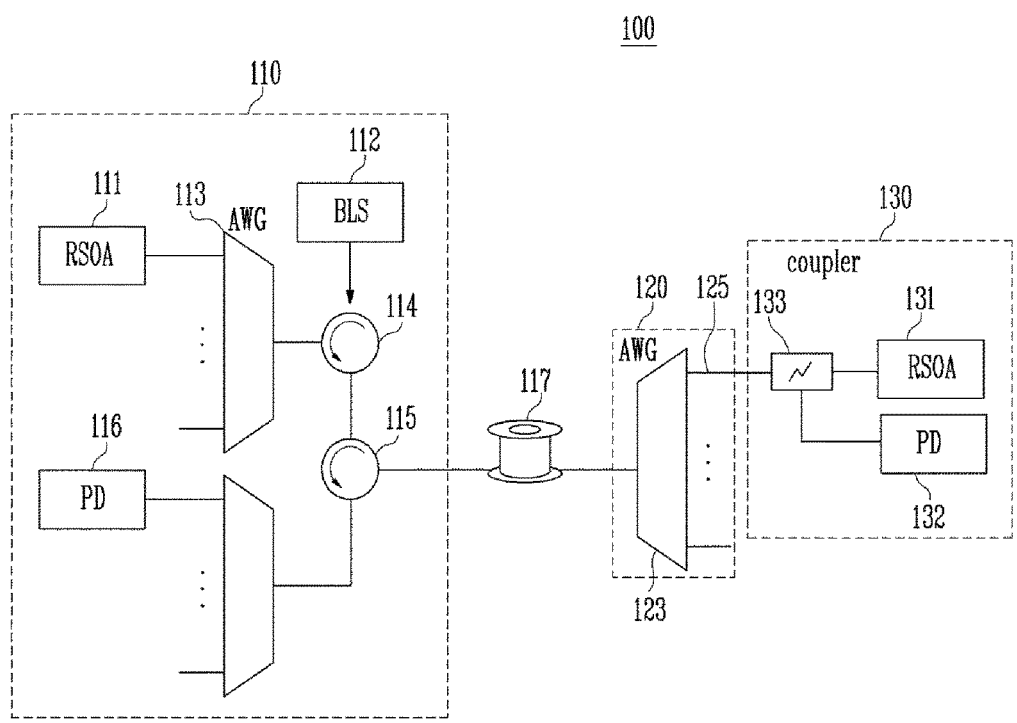
FIG. 1 is a conceptual diagram illustrating a WDM-PON system using a broadband light source.

Hereinafter, embodiments will be described in greater detail with reference to the accompanying drawings. Embodiments are described herein with reference to cross-sectional illustrations that are schematic illustrations of embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Furthermore, a singular form may include a plural from as long as it is not specifically mentioned in a sentence. Furthermore, "include/comprise" or "including/comprising" used in the specification represents that one or more components, steps, operations, and elements exist or are added.

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

In this specification, the term "laser" may be used as the same meaning as the terms "light source", "laser source", or the like.

FIG. 1 is a conceptual diagram illustrating a WDM-PON system using a broadband light source.

Referring to FIG. 1, the WDM-PON 100 may provide voice, data and broadcast convergence services. For communication between a center office (CO) and subscribers, the WDM-PON 100 uses wavelengths set for the respective subscribers. The WDM-PON 100 may include a base station transceiver (OLT: optical line terminal) 110 which is disposed in the center office (CO), a subscriber terminal (ONU: optical network unit or ONT: optical network terminal) 130 which is provided at a subscriber side, and a remote node (RN) 120. The base station transceiver 110 and the remote node 120 may be coupled with each other by a single core feeder optical fiber 117. The remote node 120 and the subscriber terminal 130 may be coupled with each other by a distribution optical fiber 125.

Downstream light to be transmitted from the base station transceiver 110 to the subscriber terminal 130 may be transmitted from a broadband light source (BLS) 112 of the base station transceiver 110 to a reflective semiconductor optical amplifier (RSOA) 111 of the base station transceiver 110 via a first optical circulator 114 and an Arrayed Waveguide Grating (AWG) 113, which performs wavelength division multiplexing and demultiplexing functions.

The downstream light transmitted to the RSOA 111 of the base station transceiver 110 passes through the AWG 113, the first optical circulator 114 and a second optical circulator 115, and is transmitted to an AWG 123 of the RN 120 through the feeder optical fiber 117, and is then transmitted to an optical coupler 133 in the subscriber terminal 130 through the distribution optical fiber 125. In this regard, the optical coupler 133 may be a circulator in various embodiments. The downstream light inputted to the optical coupler 133 may be transmitted to optical receivers 131 and 132 of the subscriber terminal 130.

Upstream light to be transmitted from the subscriber terminal 130 to the base station transceiver 110 may be transmitted in a direction opposite to that of downstream light. Upstream light is transmitted from the optical receiver 131 of the subscriber terminal 130 to the RN 120 through the optical coupler 133 and the distribution optical fiber 125. The upstream light is transmitted to the base station transceiver 110 through the AWG 123 of the RN 120 and the feeder optical fiber 117. The transmitted upstream light may be transmitted to an optical receiver 116 of the base station transceiver 110 via the second optical circulator 115 and an AWG 118 of the base station transceiver 110.

In the WDM-PON 100 using the broadband light source according to the embodiment of FIG. 1, because the light source of the base station transceiver 110 is also used for the subscriber terminal 130, a separate light source for the subscriber terminal stage is not required. Therefore, a colorless system can be embodied. However, in the WDM-PON 100 using the broadband light source, seed light is injected using the separate broadband light source, and the RSOA 111 amplifies and modulates it. Thus, the speed is limited, whereby it is recognized that it is difficult to use this method in a 10 Gbps-class system. To attempt to overcome the foregoing problem, a device integrated with a reflective electro-absorption modulator is proposed as an alternative.

Figure 2:
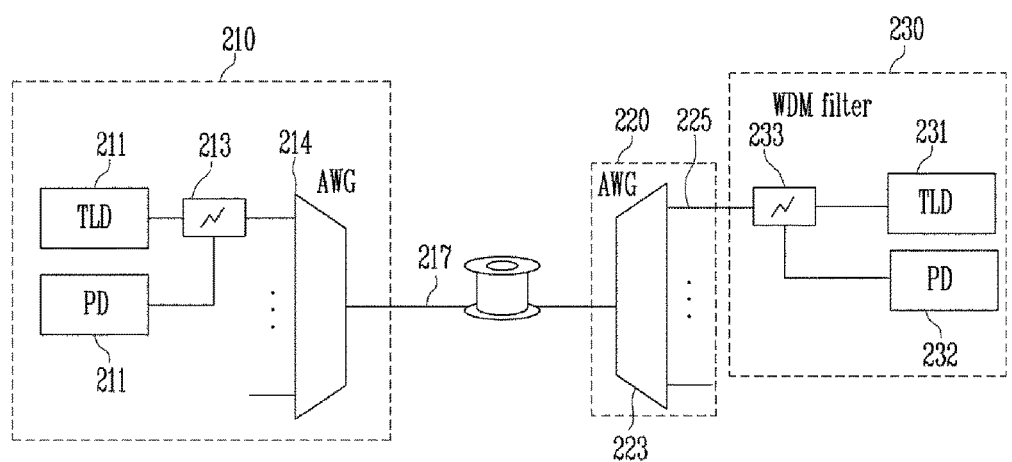
FIG. 2 is a diagram illustrating the configuration of a WDM-PON system using a wavelength-tunable light source.

FIG. 2 is a diagram illustrating the configuration of a WDM-PON system using a wavelength-tunable light source.

Referring to FIG. 2, the WDM-PON 200 may include a base station transceiver (OLT) 210 which is disposed in a center office (CO), a subscriber terminal (ONU or ONT) 330 which is provided at a subscriber side, and a remote node (RN) 220. The base station transceiver 210 and the RN 220 may be coupled with each other by a single core feeder optical fiber 217. The RN 220 and the subscriber terminal 230 may be coupled with each other by a distribution optical fiber 125.

Downstream light is transmitted from a wavelength-tunable light source (TLD: tunable laser diode) 211 of the base station transceiver 210 to an AWG 214 of the base station transceiver 210 through a WDM filter 213. The transmitted downstream light is transmitted to the RN 220 through the feeder optical fiber 217. The downstream light is transmitted to a WDM filter 233 of the subscriber terminal 230 through a distribution optical fiber 225 via an AWG 223 of the RN 220. The transmitted downstream light may be transmitted to a light-receiving unit (PD) 232 of the subscriber terminal 230 via the WDM filter 233. Upstream light may travel from a wavelength-tunable light source (TLD) 231 of the subscriber terminal 230 in a direction opposite to that of the downstream light and thus be transmitted to a light-receiving unit 212 of the base station transceiver 210.

To embody a system having no dependence on a specific wavelength, unlike the embodiment of FIG. 1, the embodiment of FIG. 2 is configured such that the wavelength-tunable light sources (TLDs) 211 and 231 are respectively provided in the base station transceiver 210 and the subscriber terminal 230. The WDM-PON of FIG. 2 is limited in that the base station transceiver 210 and the subscriber terminal 230 must have the respective light sources, but because it uses a laser, the performance can be enhanced in terms of speed, compared to the embodiment of FIG. 1. Therefore, in the WDM-PON using a wavelength-tunable light source, it is important to manufacture a wavelength-tunable light source having high reliability and performance at low cost.

An external-cavity wavelength-tunable laser is advantageous for single-mode lasing because laser light is filtered by an external cavity resonator. However, although the external cavity resonator has reliable lasing conditions under specific conditions, the lasing mode may move depending on a change in applied current, the external temperature, etc. In this case, in the external-cavity wavelength-tunable laser, a mode-hopping phenomenon, in which the lasing mode changes to an adjacent mode, may be caused. In some cases, a multi-mode lasing phenomenon or the like may be caused. If the mode hopping or multi-mode lasing phenomenon is caused, an error rate in the transmission of data may be increased in the optical communication field that uses a specific wavelength in a single mode.

Therefore, with regard to the use of the external-cavity wavelength-tunable laser, it is important to determine a stable wavelength region under given conditions or to determine stable conditions in a given wavelength region.

Hereinafter, for the sake of explanation, the following description of an embodiment of the present disclosure will be focused on an external-cavity wavelength-tunable laser using a thermo-optic effect. However, this is only for the sake of explanation, and the method of controlling the external-cavity wavelength-tunable laser according to the embodiment of the present disclosure may be applied to a typical external cavity laser in the same manner so as to correspond to the form of a discrete device.

A wavelength-tunable light source is a core device which is used in fields pertaining to optical communication, spectroscopy, sensing, and so forth. To embody the wavelength-tunable light source, various techniques have been proposed. Representative examples of the wavelength-tunable light source include a single-integrated laser which uses a Vernier effect using a semiconductor device including a sampled grating distributed Bragg reflector (SG-DBR), an external cavity laser using an external grating reflector, and an array laser which includes several single-wavelength sources configured in the form of an array and embodies multiple wavelengths.

The wavelength tuning techniques used in the external-cavity wavelength-tunable laser are classified into a technique of separating wavelengths according to diffraction angle using a microelectromechanical system (MEMS) technique, a technique using the thermo-optic (TO) effect, a technique of tuning the wavelength using voltage or current in the same manner as a liquid crystal, and so forth.

Although many advances have been made to wavelength-tunable systems using single integration, there is a problem of high prices due to low yield. In the case of the array laser, the application thereof is also limited because of its relatively large size and low yield. The external cavity laser is able to realize somewhat reliable laser operation, but there are limits caused by the large size of the external cavity laser, which must inevitably have a large size, and the high-speed operation thereof is limited.

Figure 3A:
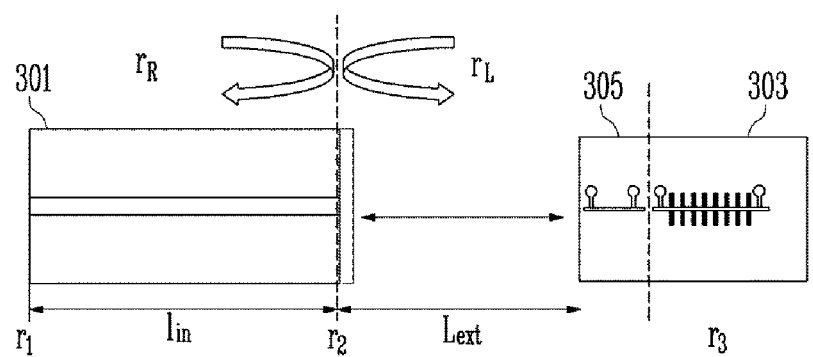
FIGS. 3A and 3B show conceptual diagrams illustrating the operational characteristics of an external-cavity wavelength-tunable laser and the position of a phase control electrode.
Figure 3B:
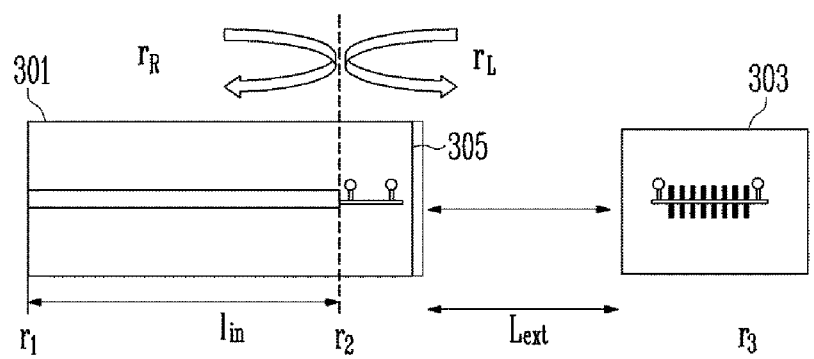

FIG. 3A and FIG. 3B show conceptual diagrams illustrating the operational characteristics of the external-cavity wavelength-tunable laser and the position of a phase control electrode.

Referring to FIG. 3A and FIG. 3B, the external-cavity wavelength-tunable laser may include a gain medium 301 and an external reflector 303. The gain medium 301 may be embodied to provide the gain required for lasing of a light source. The wavelength-tunable external reflector 303 is embodied to change a reflected central wavelength, for example, may tune the wavelength using the thermo-optic effect, plasma effect, or the like.

The gain medium 301 may be made of semiconductor materials, crystals, gas molecules, or the like. In semiconductor lasers, etc., a mode converter and the like may be integrated so as to improve optical coupling with the external reflector.

The external reflector 303 may be embodied, outside the gain medium, using a reflector having no wavelength selectivity or a Bragg grating reflector having wavelength selectivity.

The external-cavity wavelength-tunable laser may perform a wavelength tuning function based on the external reflector 303. For instance, the external-cavity wavelength-tunable laser may be embodied using a wavelength-tunable filter in which the band within which an optical signal generated from the gain medium 301 passes or is reflected is changeable depending on the application of external current, a temperature change, angle adjustment, etc. The external-cavity wavelength-tunable laser may be embodied using a polymer material, a semiconductor material, or the like. The external-cavity wavelength-tunable laser may be embodied such that wavelength tuning is possible using a change in reflective index due to a plasma effect or a thermo-optic effect or using a change in wavelength due to a change in diffraction angle.

In the case where, among external-cavity wavelength-tunable lasers, a wavelength-tunable laser based on the thermo-optic effect is embodied, optical coupling can be made between a semiconductor gain medium called a super-luminescent diode and an external reflector having a distributed Bragg grating formed on a polymer or semiconductor material having a high thermo-optic effect.

The external-cavity wavelength-tunable laser may adjust the wavelength using the thermo-optic effect. In detail, the external-cavity wavelength-tunable laser may form a heater electrode to adjust the refractive index of a device. That is, because the driving wavelength of the laser is varied by a change in temperature due to heat generated from the heat electrode, the control method for changing the wavelength is simple. However, because, depending on the material of the external-cavity wavelength-tunable laser itself, a change in wavelength may be sensitive to temperature, the lasing characteristics may be changed by a change in the external environment.

Therefore, in the case of the external cavity laser having only the gain medium and the external reflector, the lasing mode may be unstable depending on changes in the external environment. To avoid this, a phase control unit 305 is required.

The phase control unit 305 may be embodied in such a way that, as shown in FIG. 3A, it is integrated with the external reflector 303 or, as shown in FIG. 3B, it is integrated with the semiconductor gain medium 301. The two cases of FIGS. 3A and 3B are the same in terms of function, but there is a difference in terms of characteristic control when an actual device is embodied.

In detail, to embody the external-cavity wavelength-tunable laser, parasitic reflection, which deteriorates the characteristics between the gain medium 301 and the external reflector 303, must not be caused. However, in the semiconductor gain medium 301, residual reflectivity $r_2$ is present on the surface because of a comparatively low reflective coated structure or incompleteness of a tilt structure. The reflectivity in terms of the gain medium is the reflectivity rR of a cavity mirror, which is obtained by a combination of the residual reflectivity $r_2$ and reflection from the external reflector 303.

As shown in FIG. 3A, in the case where the phase control unit 305 is integrated with the external reflector 303, a portion on which the residual reflection is caused is formed outside the phase control unit 305 based on the external reflector 303. Therefore, when the phase control unit 305 is operated to change the phase of the lasing mode, the internal phase of the cavity mirror is also changed, whereby the form of the reflectivity itself may be changed.

In the case of FIG. 3B, because a portion on which the residual reflection is caused is disposed inside the phase control unit 305, only the mode is moved, without changing the reflectivity of the cavity mirror. Therefore, the case of FIG. 3b is advantageous in terms of control of the reflectivity characteristics, but there are problems of undesirable changes in the characteristics of the gain medium 301 because of heat generation, electrical isolation, and an increase in length of the resonator.

Figure 4:
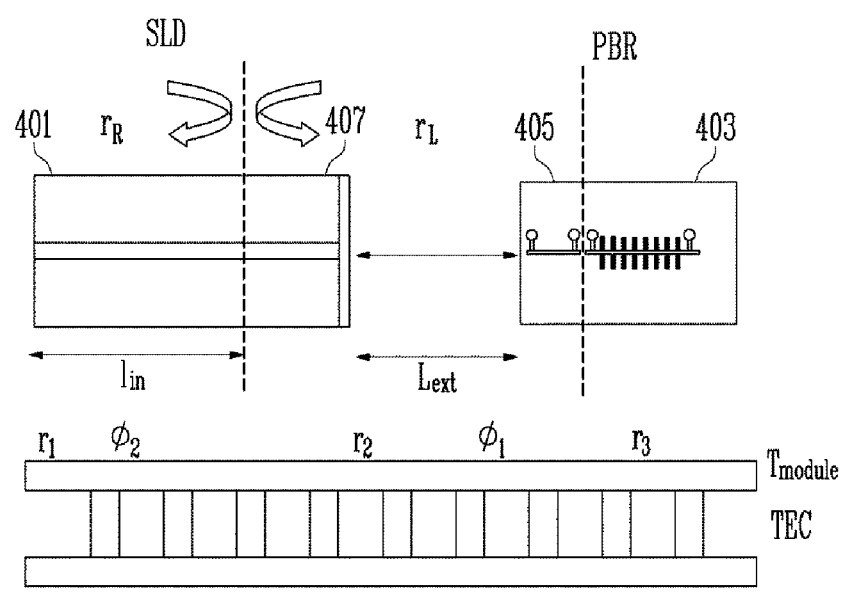
FIG. 4 is a diagram illustrating a device parameter and related device variables, which must be controlled in the external cavity wavelength-tunable light source.

FIG. 4 is a diagram illustrating a device parameter and a related device variable which must be controlled in the external cavity wavelength-tunable light source.

Referring to FIG. 4, a phase control unit 405 may be disposed on an external reflector 403, and a mode converter 407 may be provided on a semiconductor gain medium 401. Generally, to tune the wavelength of an external-cavity wavelength-tunable laser, current is applied to a heater electrode formed on the Bragg grating with a fixed overall module temperature $T_{module}$ so that the wavelength is set close to a desired wavelength, and a phase control unit 405 is controlled. In this case, although the desired wavelength can be made, a reduction in chirp attributable to a detuned loading effect can be obtained only from some wavelengths. That is, to obtain a desired detuning degree of a desired wavelength, a phase φ1 of a passive region, a phase φ2 of an active area and a lasing wavelength λPBR must be simultaneously adjusted. Therefore, current applied to the phase control unit 405 and the external reflector 403 and the overall module temperature, which are controllable variables, must be simultaneously controlled.

Figure 5A:
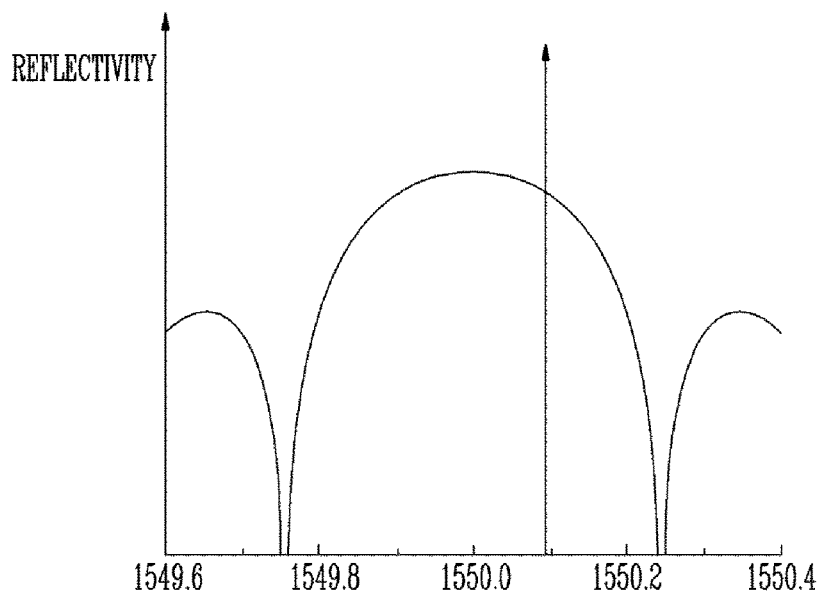
FIGS. 5A and 5B are diagrams illustrating the detuned loading effect in the external-cavity wavelength-tunable laser.
Figure 5B:
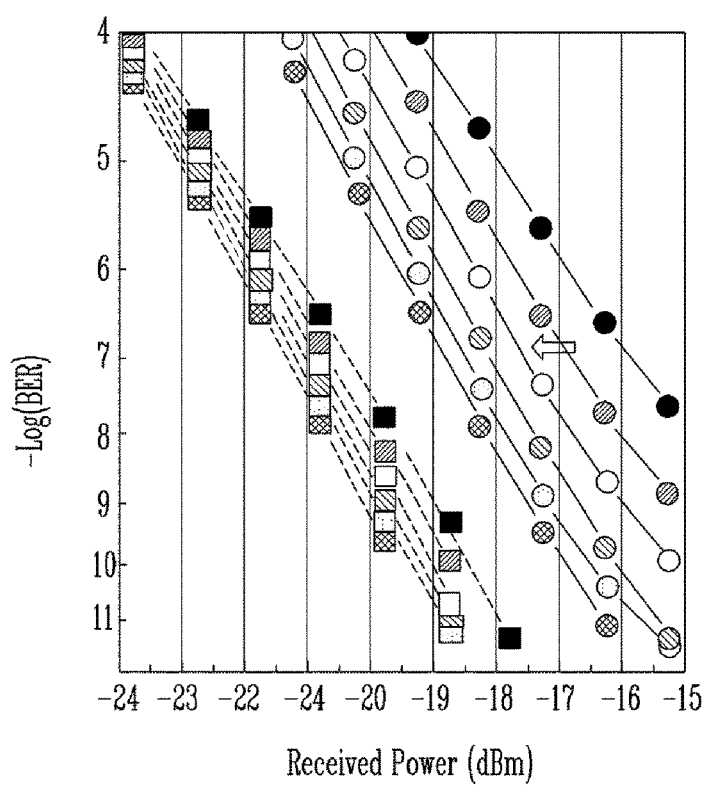

FIGS. 5A and 5B are diagrams illustrating the detuned loading effect in the external-cavity wavelength-tunable laser. A detailed description will be provided with reference to each drawing.

FIG. 5A is a graph showing a change in reflectivity depending on the wavelength of an external reflector embodied with a Bragg grating and showing a long-wavelength detuned lasing mode.

Referring to FIG. 5A, under conditions in which the lasing mode of the external-cavity wavelength-tunable laser does not move out of a stabilization region, as the lasing mode is set to a long wavelength, the effective line width increase coefficient is reduced because of the increase in effective differential gain, etc., whereby the transmission penalty is reduced.

FIG. 5B is a graph showing a bit error rate BER depending on detuning.

Referring to FIG. 5B, broken lines connecting the squares denote bit error rates BER before a signal directly modulated with 10 Gbps at a wavelength of 1545 nm is transmitted, and solid lines connecting the circles denote bit error rates when the signal is transmitted 20 km. The same shape denotes the same conditions. The arrow indicates the direction of the long-wavelength detuning. It may be understood that the longer the wavelength on which the detuning is performed, the smaller the penalty.

It may be understood that, as the detuning proceeds, a degree to which an eye opens of an eye diagram due to the long-wavelength detuning is increased.

FIGS. 6A, 6B, 6C and 6D are diagrams illustrating the detuned loading effect of reducing chirp in the external-cavity wavelength-tunable laser that performs direct modulation.

Figure 6A:
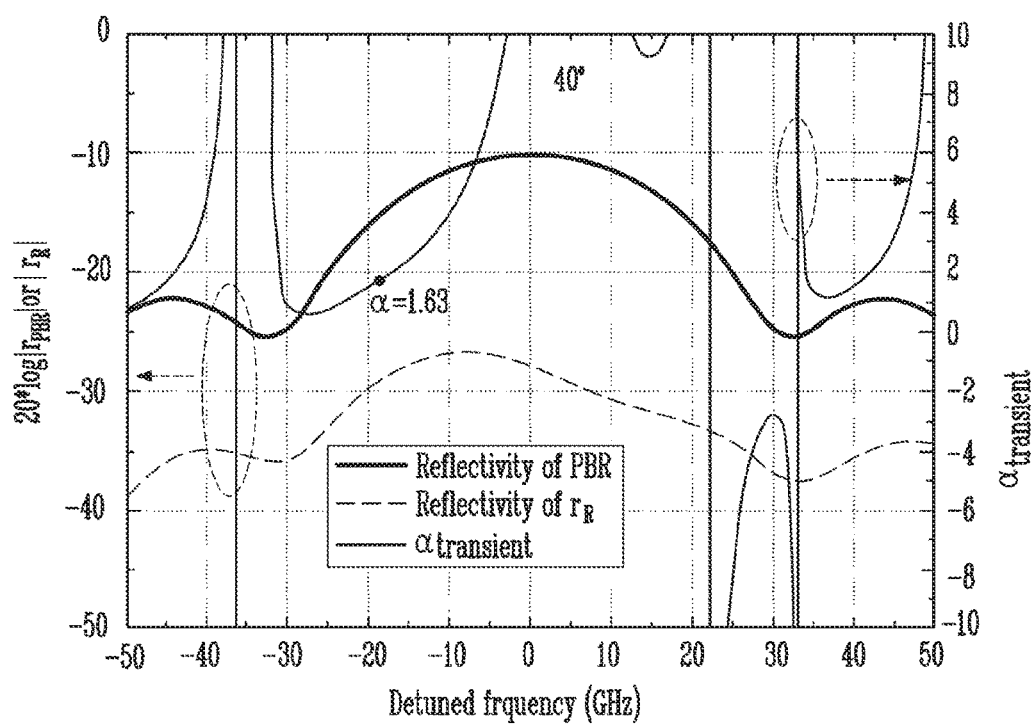
FIGS. 6A, 6B, 6C and 6D are diagrams illustrating the detuned loading effect of reducing chirp in the external-cavity wavelength-tunable laser that performs direct modulation.
Figure 6B:
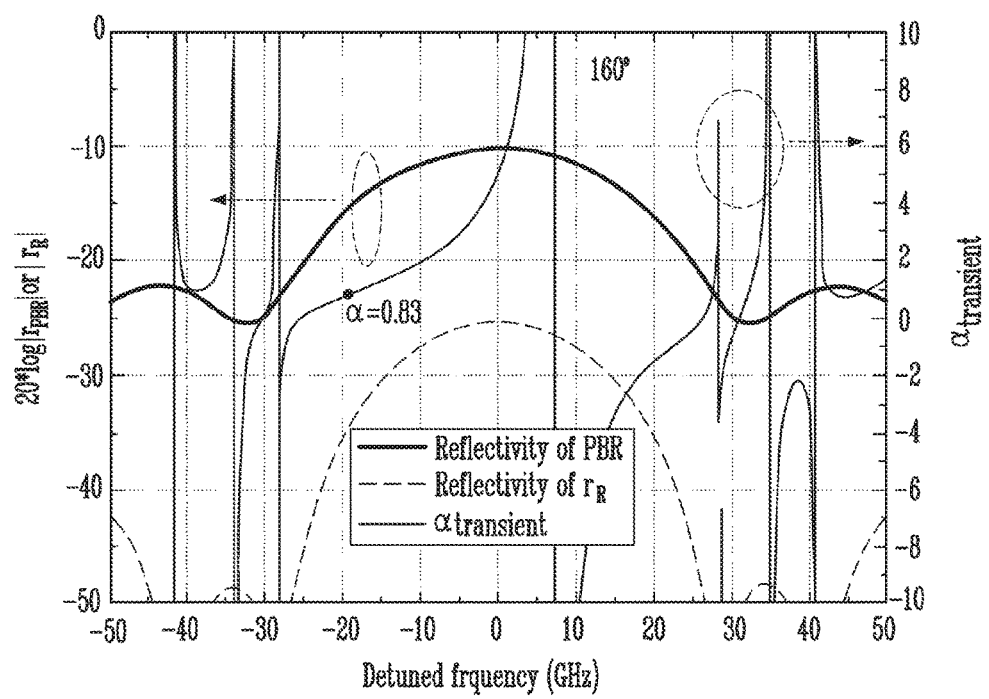
Figure 6C:
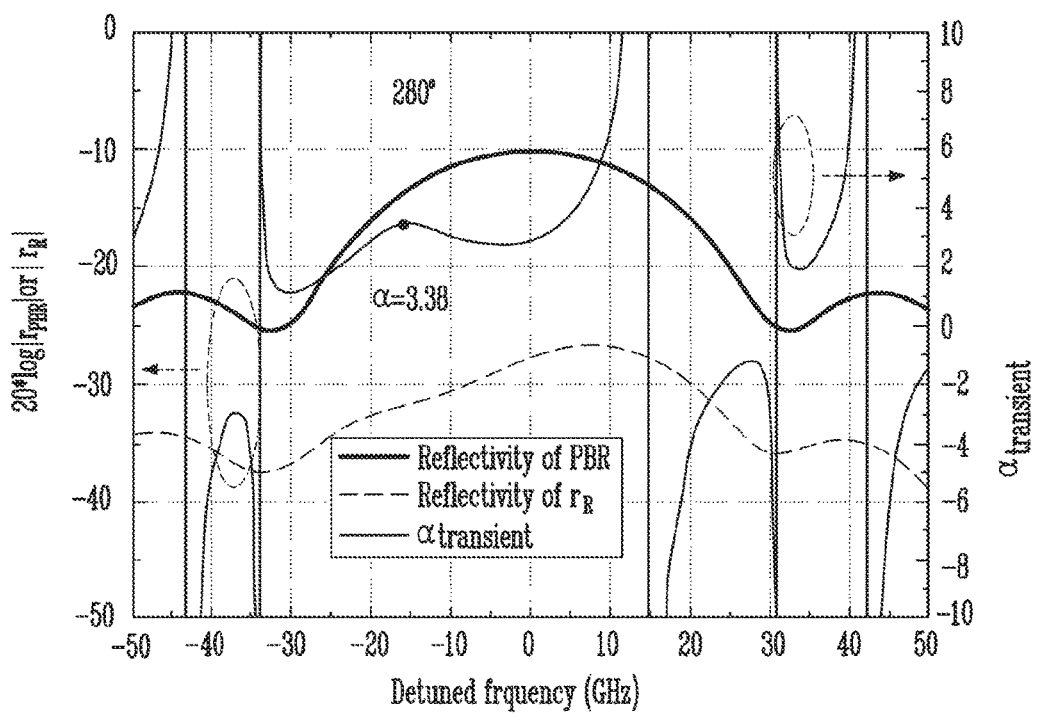
Figure 6D:
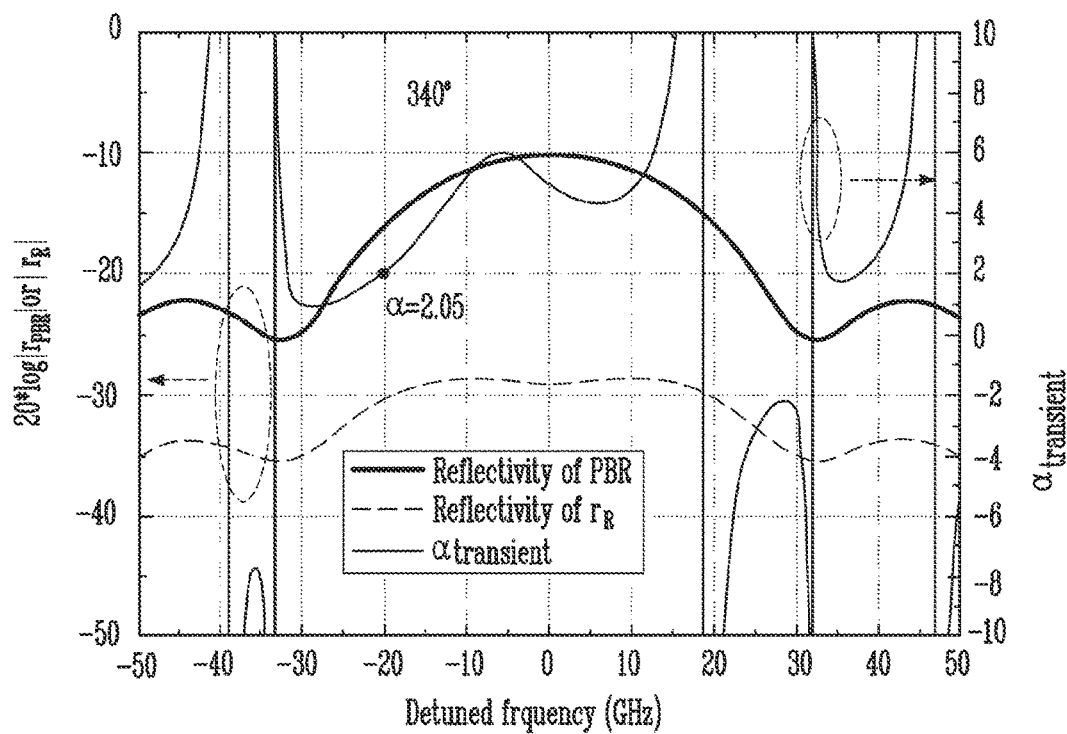

FIGS. 6A 6B, 6C and 6D show a change of the effective line width increase coefficient which can be obtained in the device depending on a change in the phase Φ1 of the passive region, described with reference to the embodiment of FIG. 4. The angle shown on each of FIGS. 6A, 6B, 6C and 6D is Φ1. The reflectivity curve of the external reflector, which is indicated by the bold line, is changed to the curve indicated by the dashed line depending on the phase Φ1 of the passive region. The effective line width increase coefficient that can be obtained depending on a change in reflectivity is shown by the thin lines. That is, FIG. 6A shows the change of the effective line width increase coefficient in the case where the phase of the passive region is 40 degrees, FIG. 6B shows the same in the case where the phase of the passive region is 160 degrees, FIG. 6C shows the same in the case where the phase of the passive region is 280 degrees, and FIG. 6D shows the same in the case where the phase of the passive region is 340 degrees.

Referring to FIGS. 6A, 6B, 6C and 6D, as the point on the effective line width increase coefficient curve proceeds toward the end of a long-wavelength-side stabilization region obtained by calculating a mode stabilization region, the change in the effective line width increase coefficient is increased, which can be obtained depending on a change in the phase on a device made of a material of which the effective line width increase coefficient is 5. In other words, it may be understood that, to obtain the best chirp characteristics in a desired wavelength, the lasing mode must be disposed on the end of the long wavelength under conditions in which the phase of the passive region is 160 degrees (FIG. 6B). Therefore, for this, additional device variable adjustment is required.

Examples of a method that can be used in setting long-wavelength detuning suitable for long distance transmission include a method of indirectly monitoring a wavelength change through OSA, and a method of directly checking transmission characteristics through measurement of a transmission eye diagram or error rate (BER) penalty. However, because these methods require the use of separate measurement equipment, it is difficult to apply them to the actual environment where the device is used. In addition, there are an excessively large number of combinations to figure out conditions of cases where there are three kinds of control variables of the device, so these methods require a lot of time. However, optical power or voltage makes it possible to easily perform monitoring without separate measurement or control equipment and to rapidly collect data. Therefore, practical detuning control is possible using a detuning state and correlation of changes in values thereof. In the present invention, a method capable of performing the detuning control using monitoring of optical power is disclosed.

Figure 7A:
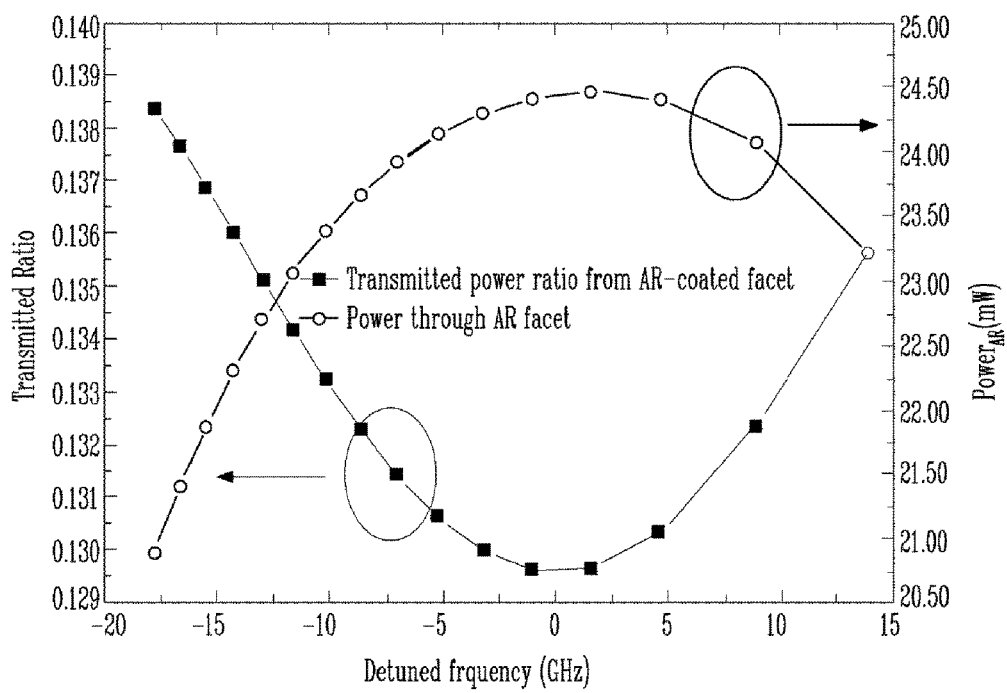
FIGS. 7A and 7B are diagrams illustrating a method of determining output power in the external-cavity wavelength-tunable laser.
Figure 7B:
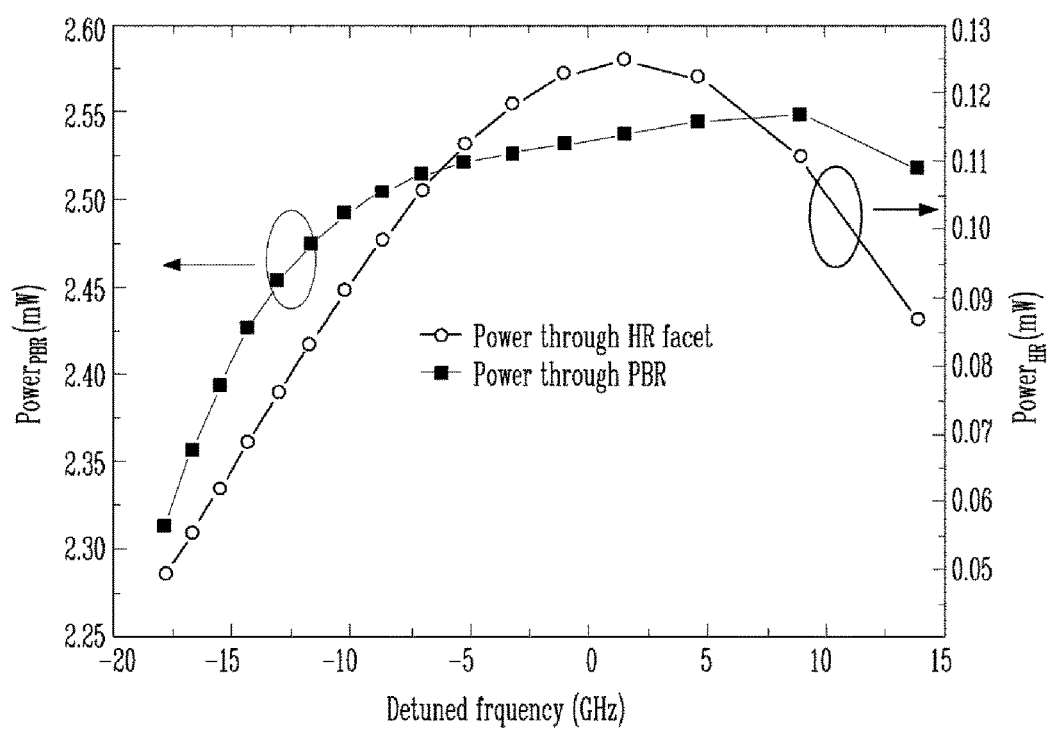

FIGS. 7A and 7B are diagrams illustrating a method of determining output power in the external-cavity wavelength-tunable laser.

The method of determining the output power will be described with reference to FIGS. 7A and 7B. The external-cavity wavelength-tunable laser may have output from the external reflector and output from the high-reflective coated surface (reflectivity r1) of the gain medium. The output from the external reflector refers to "$POWER_{PBR}$", and the output from the high-reflective coated surface of the gain medium refers to "$POWER_{HR}$" (see, FIG. 7B).

Furthermore, the term "$POWER_{AR}$" of FIG. 7A refers to power output from the surface of the gain medium that has residual reflectivity $r_2$ to the external reflector. Because of the effect of the external reflector having the reflectivity curve of FIG. 5A, $POWER_{AR}$ is highest around the detuned frequency 0, at which the reflectivity is high, as shown in FIG. 7A. Referring to FIG. 7B, it may be understood that the graph of the output power $POWER_{HR}$ from the high-reflective coated surface on which characteristics depending on the wavelength are equally applied therefore shows a similar tendency with that of $POWER_{AR}$. Transmitted Ratio of FIG. 7A indicates a ratio of light passing through the external reflector among $POWER_{AR}$. It is shown that, because of the effect of the reflectivity, the transmitted ratio is lowest around the detuned frequency 0 and is increased moving to opposite ends of the frequency region on which the reflectivity is lowered. As a result, because $POWER_{PBR}$ is determined based on power $POWER_{AR}$ coming out of the gain medium and on the transmitted ratio, it is expressed in the form of the curve of FIG. 7B, which indicates $POWER_{HR}$. In comparison between $POWER_{PBR}$ and $POWER_{HR}$, there is a large difference in the degree of a power change depending on detuning. That is, in the case of $POWER_{HR}$ in which the wavelength dependence effect of the reflectivity is applied in only one direction, the power change is much larger than that of the case of $POWER_{PBR}$ in which the wavelength dependence effect of the reflectivity is applied in different directions. Such a large change is advantageous to monitoring characteristics.

Figure 8A:
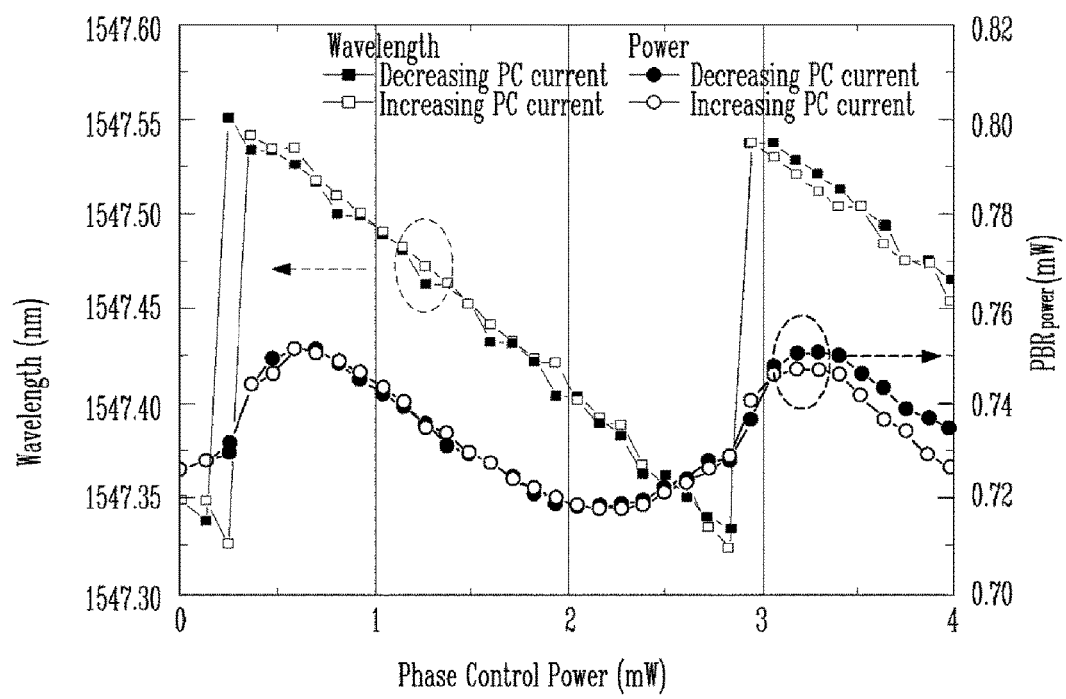
FIGS. 8A and 8B are graphs showing output power measured at opposite ends of the external-cavity wavelength-tunable laser.
Figure 8B:
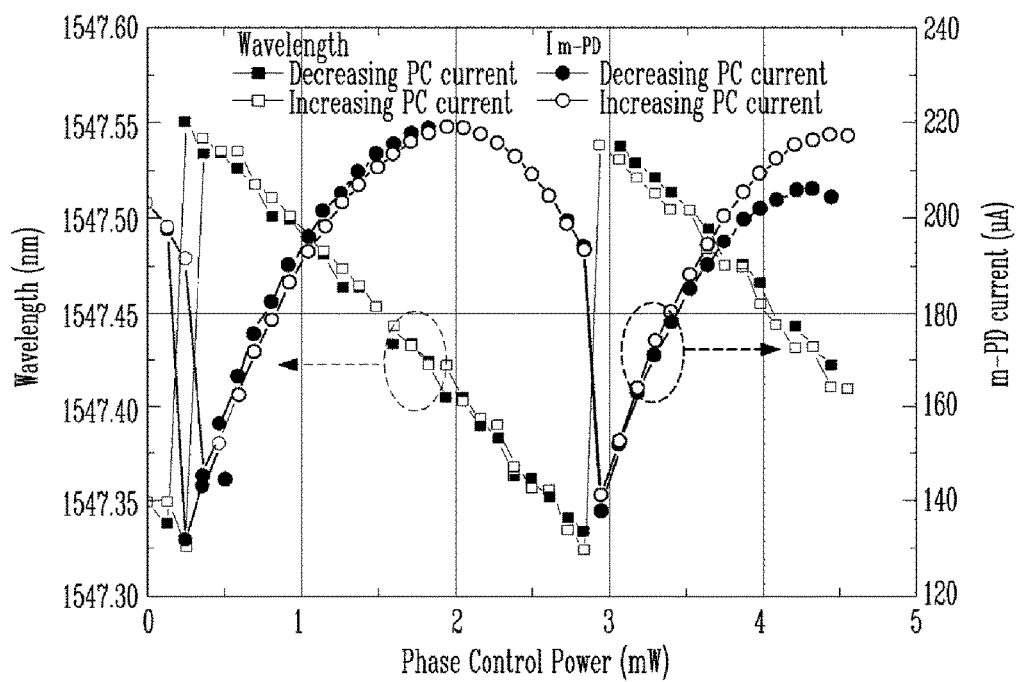

FIGS. 8A and 8B are graphs showing output power measured on opposite ends of the external-cavity wavelength-tunable laser.

In detail, FIGS. 8A and 8B show power changes measured depending on detuning. With regard to comparison of two powers under the same operation conditions, it may be understood that, in the same manner as the result of FIGS. 7A and 7B, a change rate of m-PD current measured by receiving $POWER_{HR}$ using a monitor photodiode is much larger than that of $POWER_{PBR}$. Furthermore, there is a more distinct power change on the end of the long-wavelength detuning. Due to these two characteristics, in the present embodiment, it may be understood that detuning control using monitoring the power of the external-cavity wavelength-tunable laser is preferably implemented using $POWER_{HR}$.

FIGS. 9A, 9B, 9C and 9D are graphs showing a change of output power depending on a phase change in the external-cavity wavelength-tunable laser.

Figure 9A:
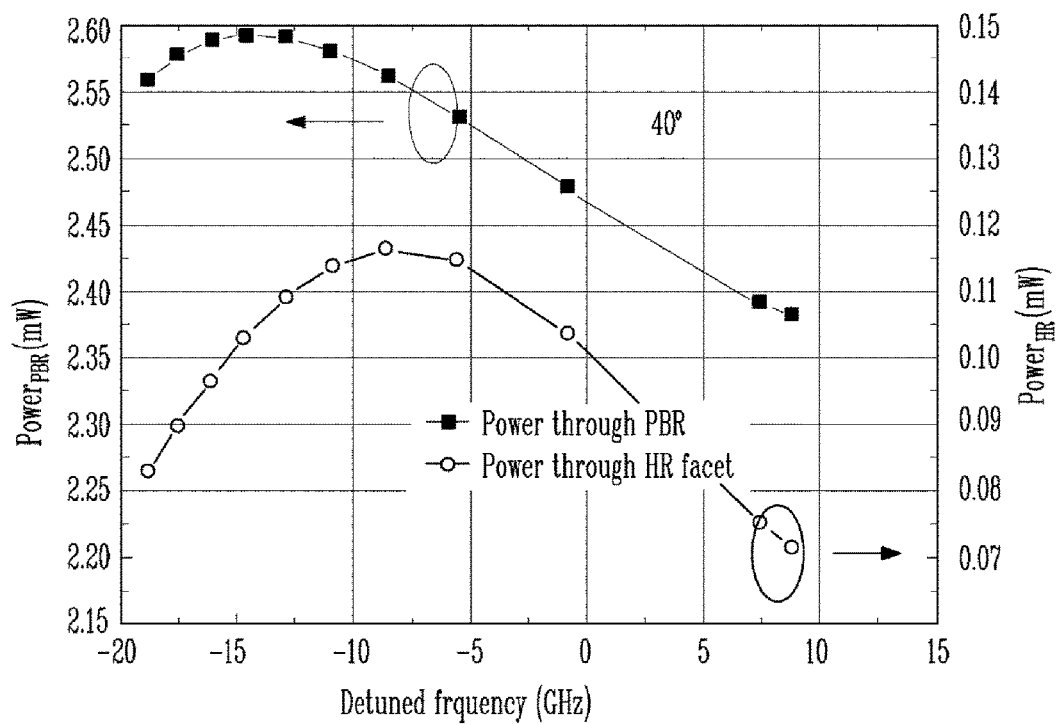
FIGS. 9A, 9B, 9C and 9D are graphs showing the change of output power depending on phase change in the external-cavity wavelength-tunable laser.
Figure 9B:
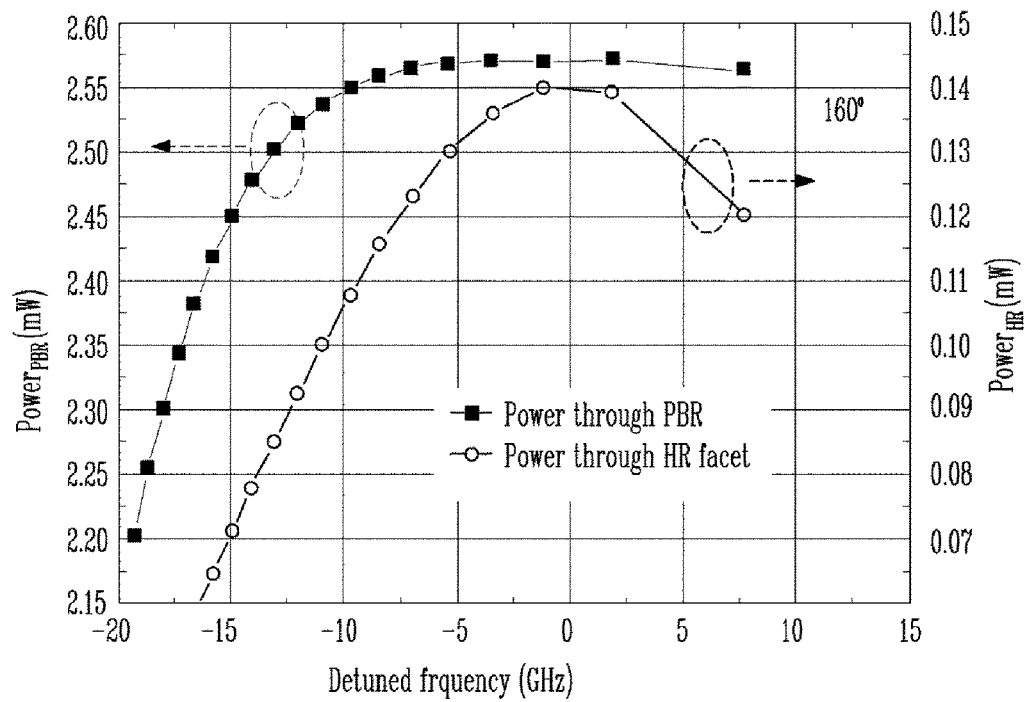
Figure 9C:
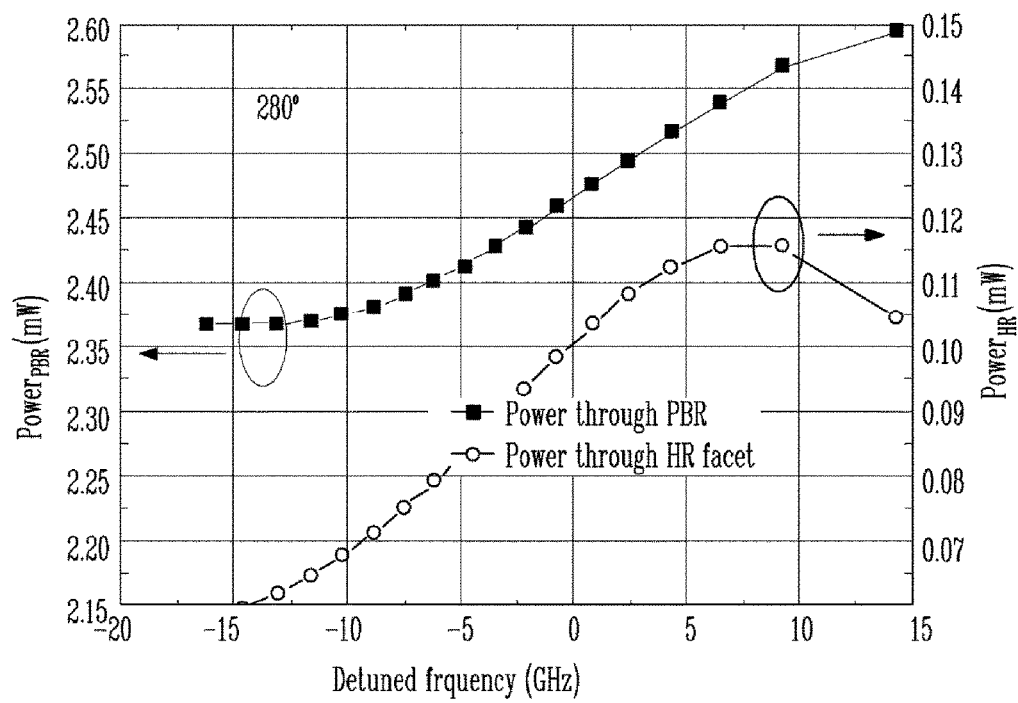
Figure 9D:
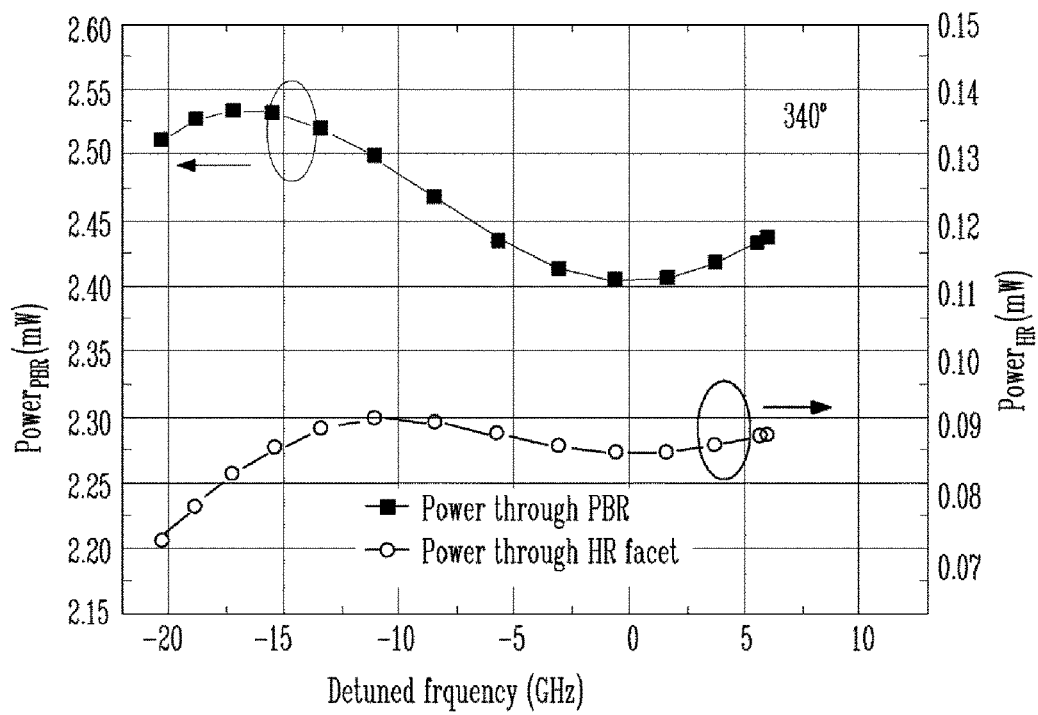

In detail, FIG. 9A shows a change of the output power in the case where the phase of the passive region is 40 degrees, FIG. 9B shows the same in the case where the phase of the passive region is 160 degrees, FIG. 9C shows the same in the case where the phase of the passive region is 280 degrees, and FIG. 9D shows the same in the case where the phase of the passive region is 340 degrees.

Referring to FIGS. 9A, 9B, 9C and 9D, it is shown that the case of FIG. 9D, which has phase conditions with power chirp characteristics, is lowest in the maximum value of the power to be determined depending on detuning.

A detuning control method using power will be described in detail for each of the two kinds of device structures introduced in FIG. 3.

In the device having the structure of the phase control unit 305 shown in FIG. 3b, when detuning (detuning sweep) is caused by applying current to the phase control unit 305, the device has a predetermined passive region phase, so that only the lasing mode is detuned, without a change in an external reflectivity curve. Therefore, in this case, curves having the same forms of those of FIGS. 9A, 9B, 9C and 9D may be obtained. When this is measured under conditions of different module temperatures and different external reflector heater currents, one of the curves of FIGS. 9A, 9B, 9C and 9D is obtained. Of them, conditions of the case of FIG. 9B, which are the best chirp conditions, are selected, and are then set as device conditions.

In the device structure shown in FIG. 3a, when the phase control unit 305 is operated, the passive region phase continuously varies. Therefore, the same results as the $POWER_{HR}$ curves of FIGS. 9A, 9B, 9C and 9D, which are calculated with the fixed passive region phase, may not be obtained. However, to operate the mode on the end of the long-wavelength stabilization region, the minimum chirp conditions may be set using characteristics in which the line passes through the point at which the detuned frequency is 0 and there is a phase difference of approximately 180 degrees. That is, with regard to several conditions of different module temperatures and different external reflector heater currents, the detuning sweep is performed while the current of the phase control unit 305 is changed. Then, various curves are obtained. Among these curves, the curve the maximum value of which is smallest corresponds to the module temperature and external reflector heater current conditions under which the minimum chirp characteristics can be obtained. When long-wavelength detuning is performed under these conditions and it is sent to the end of the stabilization region, the desired minimum chirp conditions can be obtained.

Figure 10A:
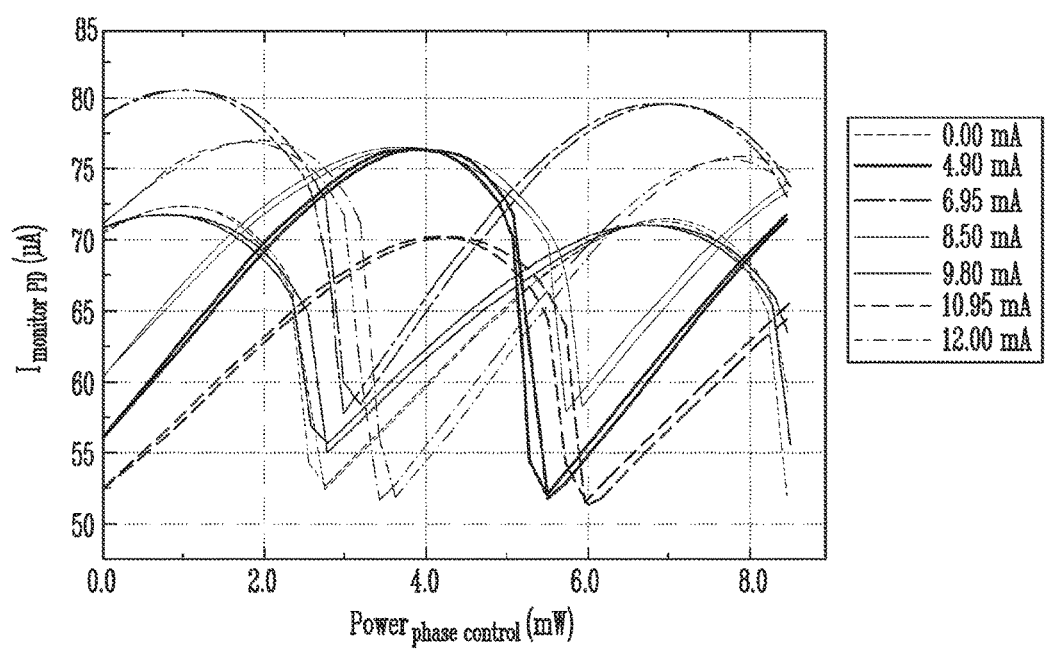
FIGS. 10A and 10B are graphs showing transmission penalty as a function of a change in the output power when detuning sweep is performed while heater current of an external reflector is changed at a constant temperature according to an embodiment of the present disclosure.
Figure 10B:
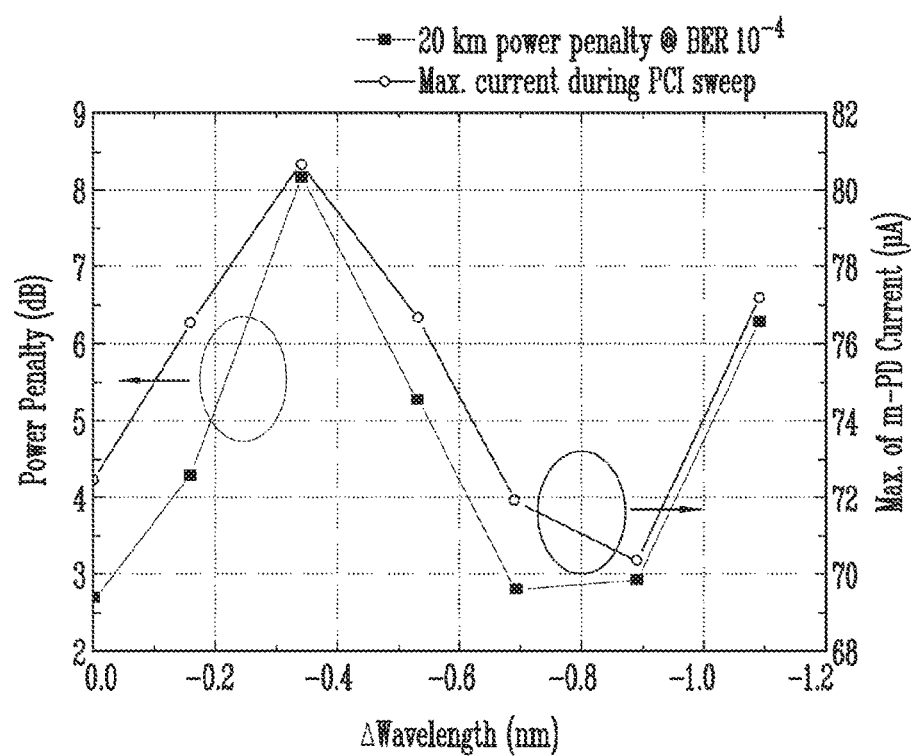

FIGS. 10A and 10B are graphs showing the transmission penalty as a function of a change in the output power when the detuning sweep is performed while the external reflector heater current is changed at a constant temperature according to the present embodiment.

That is, FIGS. 10A and 10B are graphs showing $POWER_{HR}$ expressed by output current of a monitor PD obtained when the detuning sweep is performed while the wavelength is changed by varying only the external reflector heater current at a constant module temperature, and showing the power penalty when a signal that is directly modulated at a speed of 10 Gbps is transmitted 20 km under the chirp conditions optimized under conditions of respective module temperatures and heater currents. Referring to FIGS. 10A and 10B, under conditions in which the maximum value on the detuning sweep curve is smallest, the transmission penalty has the smallest value. It may be understood that, as shown in the measurement result of FIGS. 10A and 10B, these conditions can be obtained only for a specific wavelength in a state in which the temperature is maintained constant. Under the module temperature and heater current corresponding to the minimum chirp conditions, the long-wavelength detuning point is set by applying a predetermined offset to the minimum power point during the detuning sweep. The reason for this is because hopping of the external cavity laser mode is caused by chirp around the minimum value.

Figure 11A:
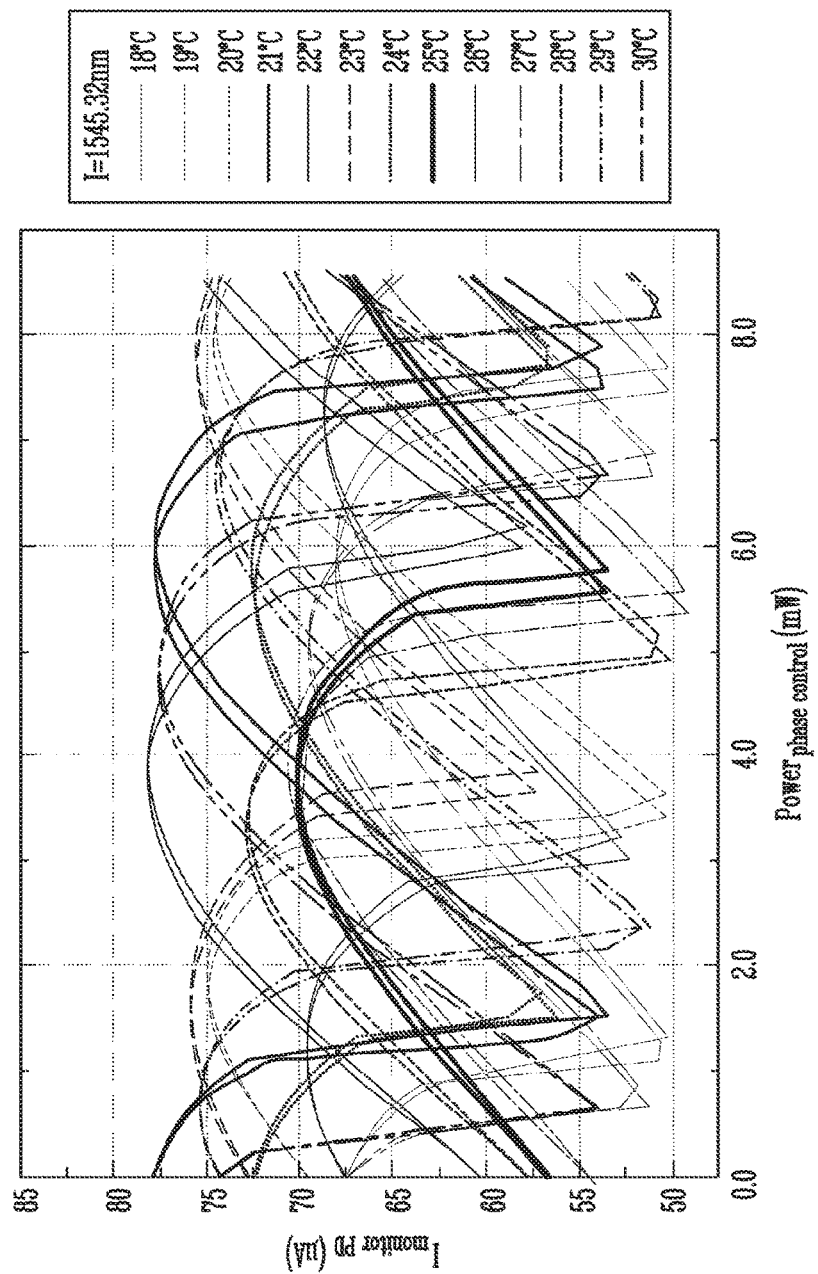
FIGS. 11A and 11B are graphs showing a change of a rear output power which is caused when the detuning sweep is performed while the temperature and the external reflector heater current are simultaneously changed so as to maintain the wavelength constant, and showing a change of the transmission penalty depending on the change of the rear output power according to an embodiment of the present disclosure.
Figure 11B:
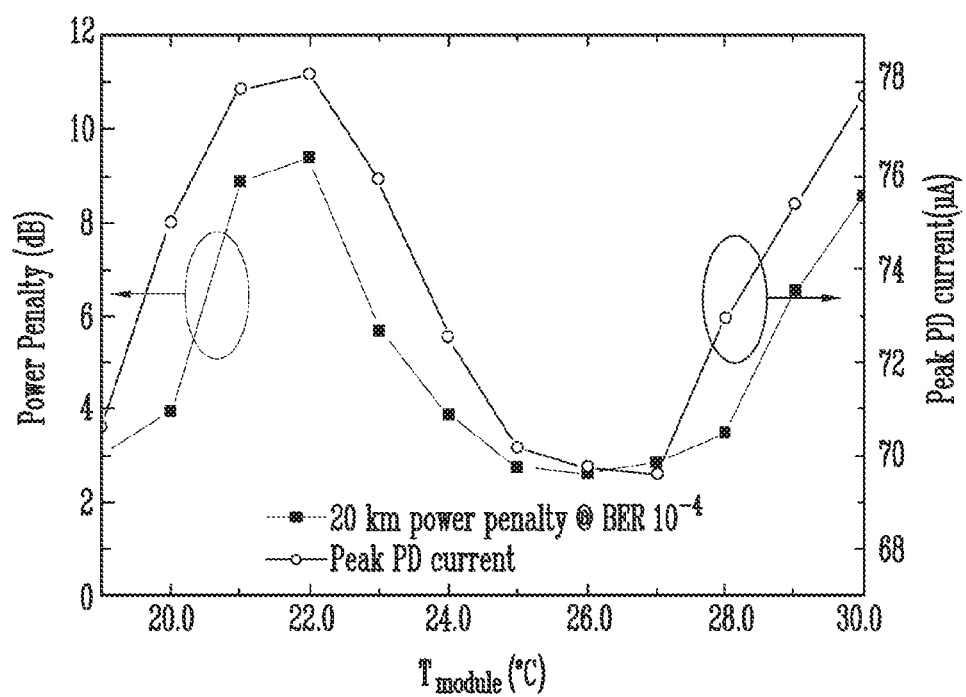

FIGS. 11A and 11B are graphs showing a change of a rear output power, which is caused when the detuning sweep is performed while the temperature and the external reflector heater current are simultaneously changed so as to maintain the wavelength constant, and showing a change of transmission penalty depending on the change of the rear output power according to the present embodiment.

In detail, FIGS. 11A and 11B show detuning sweep curves measured while the module temperature and the external reflector heater current are simultaneously changed so as to maintain the wavelength constant, and the results of measuring the power penalty obtained under the respective conditions. Referring to FIGS. 11A and 11B, for any wavelength, if conditions including the module temperature are set at the optimum values, operation under the minimum chirp conditions is possible.

Figure 12:
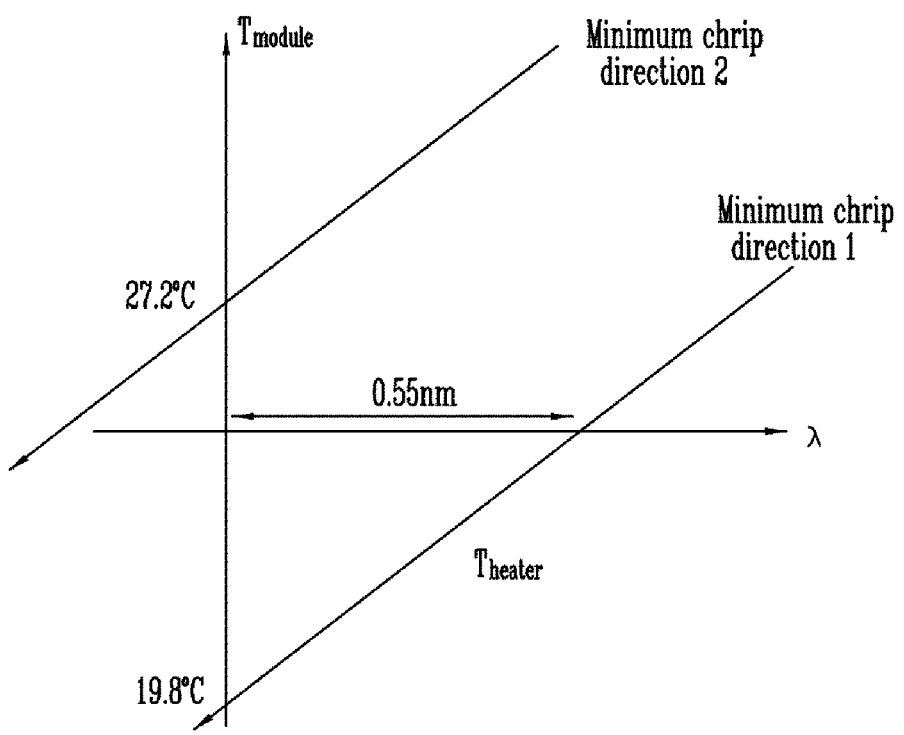
FIG. 12 is a diagram showing a change of a wavelength value for obtaining the minimum-chirp performance in the external-cavity wavelength-tunable laser.

FIG. 12 is a diagram showing a change of a wavelength value for obtaining the minimum-chirp performance in the external-cavity wavelength-tunable laser.

Although temperature values are expressed in FIG. 12, these are only illustrative data, and the invention is not limited to the expressed values. Referring to FIG. 12, it is shown that, as the lasing wavelength is reduced, the minimum chirp condition moves to a lower module temperature. Through this curve, the minimum chirp conditions for semi-continuous lasing wavelength may be set. In detail, when the wavelength of the external-cavity wavelength-tunable laser is set to an arbitrary value, the wavelength of the device is changed in each minimum chirp condition direction (minimum chirp direction 1). During this process, if the degree to which the wavelength is displaced from the typical module operation condition is excessively increased and thus the change of output characteristics is increased, it moves in the next minimum chirp condition direction (minimum chirp direction 2). Then, for all wavelengths within the tunable wavelength range of the device, the minimum chirp conditions can be obtained. The slope of the relationship between the module temperature and the wavelength, by which the minimum chirp conditions of the device are expressed, is previously measured in a calibration operation and is formularized. Then, only for the first wavelength, the minimum chirp conditions are determined through the detuning sweep, and for the other wavelengths, the minimum chirp conditions may be obtained using this curve. In an embodiment, under the minimum chirp conditions for the other wavelengths, long-wavelength detuning may be realized if the phase control currents are set to have the same value. This is caused by the fact that, even when the wavelengths are different, the detuning states in the device are the same as each other under the conditions in which the minimum chirp is obtained. In various embodiments, when more precise chirp control is required, the minimum chirp conditions are obtained using a formula, and then the detuning sweep is performed again at a desired wavelength position. As a result, the minimum chirp conditions for a desired wavelength may be obtained.

FIG. 13 is a flowchart showing a method of controlling the external-cavity wavelength-tunable laser according to an embodiment of the present disclosure.

Referring to FIG. 13, at step 1301, the external-cavity wavelength-tunable laser receives a desired wavelength to be output. At step 1303, the external-cavity wavelength-tunable laser may perform primary calibration. The primary calibration is the step of obtaining a combination of approximate device conditions capable of embodying a specific wavelength. Because the central wavelength of the reflectivity of the external reflector is moved by the heater power of the external reflector and the module temperature, the lasing wavelength may be determined based on two conditions in an approximate range, excluding the detuning effect. Determining such a functional formula is the primary calibration step.

At step 1305, the external-cavity wavelength-tunable laser performs, using the result of the primary calibration, the detuning sweep for a combination of an external reflector heater current and a module temperature that can generate the corresponding wavelength in a nearby wavelength band. Thereby, the minimum chirp conditions can be obtained.

At step 1307, the external-cavity wavelength-tunable laser may determine whether the obtained minimum chirp conditions are the minimum chirp conditions for the desired wavelength. As the result of the determination, if the lasing wavelength corresponding to the obtained conditions is not the desired wavelength, secondary calibration is performed at step 1309.

In this regard, the secondary calibration is the step of obtaining an inclination of a curve (shown in FIG. 12) indicating a change of the temperature of the module as a function of the wavelength on which the minimum chirp conditions are formed. At step 1311, the external-cavity wavelength-tunable laser obtains the minimum chirp conditions for the desired wavelength using the result of the secondary calibration.

In various embodiments, although not shown in the drawings, if the external-cavity wavelength-tunable laser may interlock with a wavelength locking device during movement to a nearby wavelength having the minimum chirp conditions as the result of the secondary calibration, the wavelength can be accurately tuned to the desired wavelength.

In an embodiment, the external-cavity wavelength-tunable laser may be operated after the two calibration operations of step 1303 and step 1309 of FIG. 13 have been previously completed. To operate the device under the minimum chirp conditions at the specific wavelength after the two calibration operations have been previously completed, a desired wavelength is input, and is moved to the approximate location of a nearby wavelength using the formula obtained from the primary calibration. Thereafter, detuning sweep for a combination of an external reflector heater current and a module temperature capable of forming the corresponding wavelength is performed. As a result, the minimum chirp conditions are obtained. If the lasing wavelength of the obtained conditions does not correspond to the desired wavelength, the wavelength may be moved to a nearby wavelength having the minimum chirp conditions using a formula obtained through the secondary calibration.

In the above-discussed embodiments, all steps may be selectively performed or skipped. In addition, the steps in each embodiment may not always be performed in regular order. Furthermore, the embodiments disclosed in the present specification and the drawings just aim to help those with ordinary knowledge in this art more clearly understand the present disclosure rather than aiming to limit the bounds of the present disclosure. In other words, one of ordinary skill in the art to which the present disclosure belongs will be able to easily understand that various modifications are possible based on the technical scope of the present disclosure.

In various embodiments of the present disclosure, a laser can have minimum chirp characteristics in an entire tunable wavelength region and can transmit a signal several tens of kilometers in a high-speed transmission system of a direct-modulation 10 Gbps or more class.

Furthermore, in various embodiments of the present disclosure, a wavelength-tunable light source having high reliability and performance for the WDM-PON can be embodied at low cost.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of controlling a wavelength of an external-cavity wavelength-tunable laser, comprising:
  performing primary calibration of obtaining a relation between a heater power of an external reflector, a module temperature and a specific wavelength within a wavelength range of the external-cavity wavelength-tunable laser;
  performing secondary calibration, including:
    calculating the maximum output powers by changing a current of a phase control unit for combinations of the heater power of the external reflector and the module temperature corresponding to the specific wavelength based on the relation, and
    obtaining a minimum chirp condition at the specific wavelength by selecting a first heater power of the external reflector, a first module temperature, and a first current of the phase control unit corresponding to a smallest value among the calculated maximum output powers; and performing a wavelength locking operation of setting, based on results of the primary calibration and the secondary calibration, the first heater power of the external reflector and the first module temperature and the first current of the phase control unit such that the external-cavity wavelength-tunable laser is operated under the minimum chirp condition at the specific wavelength.

2. The method according to claim 1, wherein the primary calibration is performed based on a wavelength change depending on the heater power of the external reflector and the module temperature.

3. The method according to claim 1, wherein the performing secondary calibration comprises:

applying a predetermined offset current from a minimum power point to the phase control unit such that the external-cavity wavelength-tunable laser is operated under the minimum chirp condition at the specific wavelength.

4. The method according to claim 1, wherein the performing secondary calibration further comprises:

monitoring an output power coming out of a high-reflective coated surface of a gain medium of the external-cavity wavelength-tunable laser.

5. An apparatus of controlling a wavelength of an external-cavity wavelength-tunable laser, comprising:

an external-cavity wavelength-tunable laser configured to output light within a tunable wavelength range; and a control unit configured to control output of the external-cavity wavelength-tunable laser, wherein the external-cavity wavelength-tunable laser comprises:

a gain medium for lasing radiated light;

an external reflector configured to control a central wavelength of the lased light; and a phase control unit configured to control a lasing mode phase of the lased light, wherein the control unit is configured to perform primary calibration of obtaining a relation between a heater power of the external reflector, a module temperature and a specific wavelength within a wavelength range of the external-cavity wavelength-tunable laser, performing secondary calibration, including:

calculating the maximum output powers by changing a current of a phase control unit for combinations of the heater power of the external reflector and the module temperature corresponding to the specific wavelength based on the relation, and obtaining a minimum chirp condition at the specific wavelength by selecting a first heater power of the external reflector, a first module temperature, and a first current of the phase control unit corresponding to a smallest value among the calculated maximum output powers; and perform a wavelength locking operation of setting, based on results of the primary calibration and the secondary calibration, the first heater power of the external reflector, the first module temperature and the first current of the phase control unit such that the external-cavity wavelength-tunable laser is operated under the minimum chirp condition at the specific wavelength.

6. The apparatus according to claim 5, wherein the phase control unit is integrated on the external reflector.

7. The apparatus according to claim 5, wherein the phase control unit is integrated on the gain medium.

8. The apparatus according to claim 5, wherein the control unit performs the primary calibration based on a wavelength change depending on the heater power of the external reflector and the module temperature.

9. The apparatus according to claim 5, wherein the control unit is configured to apply a predetermined offset current from a minimum power point to the phase control unit such that the external-cavity wavelength-tunable laser is operated under the minimum chirp condition at the specific wavelength.

10. The apparatus according to claim 5, wherein the control unit is further configured to monitor an output power coming out of a high-reflective coated surface of the gain medium of the external-cavity wavelength-tunable laser.

* * * * *